(12) United States Patent
Oda

(10) Patent No.: US 6,313,036 B1
(45) Date of Patent: Nov. 6, 2001

(54) METHOD FOR PRODUCING SEMICONDUCTOR DEVICE

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/010,927

(22) Filed: Jan. 22, 1998

(30) Foreign Application Priority Data

Jan. 24, 1997 (JP) .................................................... 9-026203

(51) Int. Cl.[7] .................................................. H01L 21/44
(52) U.S. Cl. ............................................. 438/682; 438/683
(58) Field of Search .................................... 438/300, 301, 438/303, 305, 683, 655, 656, 659, 644, 665; 257/352, 9, 372, 383, 384

(56) References Cited

U.S. PATENT DOCUMENTS

| | | | |
|---|---|---|---|
| 3,874,920 | * 4/1975 | Chappelow et al. | 438/764 |
| 4,753,897 | * 6/1988 | Lund et al. | 438/296 |
| 5,286,678 | * 2/1994 | Rastogi | 438/201 |
| 5,346,860 | * 9/1994 | Wei | 438/201 |
| 5,516,711 | * 5/1996 | Wang | 438/217 |
| 5,753,530 | * 5/1998 | Akamine et al. | 438/560 |
| 5,759,899 | * 6/1998 | Saito | 438/303 |
| 5,759,901 | * 6/1998 | Loh et al. | 438/305 |
| 5,841,173 | * 11/1998 | Yamashita | 257/384 |
| 5,880,505 | * 3/1999 | Fujii et al. | 257/283 |
| 5,915,204 | * 6/1999 | Sumi | 438/683 |
| 5,940,699 | * 8/1999 | Sumi et al. | 438/233 |

FOREIGN PATENT DOCUMENTS

| | | |
|---|---|---|
| 55-154768 | 12/1980 | (JP) . |
| 1-283965 | 11/1989 | (JP) . |
| 5-226647 | 9/1993 | (JP) . |
| 7-263682 | 10/1995 | (JP) . |
| 8-306802 | 11/1996 | (JP) . |
| 8-330253 | 12/1996 | (JP) . |

OTHER PUBLICATIONS

Iizuki, Tetsuya, *CMOS Cho–LSI no Sekkei*, (Design of CMOS Ultra–LSI), 1st ed., third reprint, Baifukan, Nov. 20, 1991, p. 55–57.

* cited by examiner

*Primary Examiner*—Long Pham
*Assistant Examiner*—William David Coleman
(74) *Attorney, Agent, or Firm*—Hutchins, Wheeler & Dittmar

(57) ABSTRACT

The method of producing semiconductor device comprises ion implanting a first p-type impurity to form a p-type source-drain region 7 and a heat-treatment to activate followed by ion implantation of a second p-type impurity, ion-implanting a third impurity to convert the surface of at least a diffusion layer of a source-drain portion into amorphous to form titanium silicide 9. This reduces contact resistance between the titanium silicide layer and the p-type impurity layer to improve the current driving performance of the p-type MOS transistor.

13 Claims, 7 Drawing Sheets

(Prior Art)

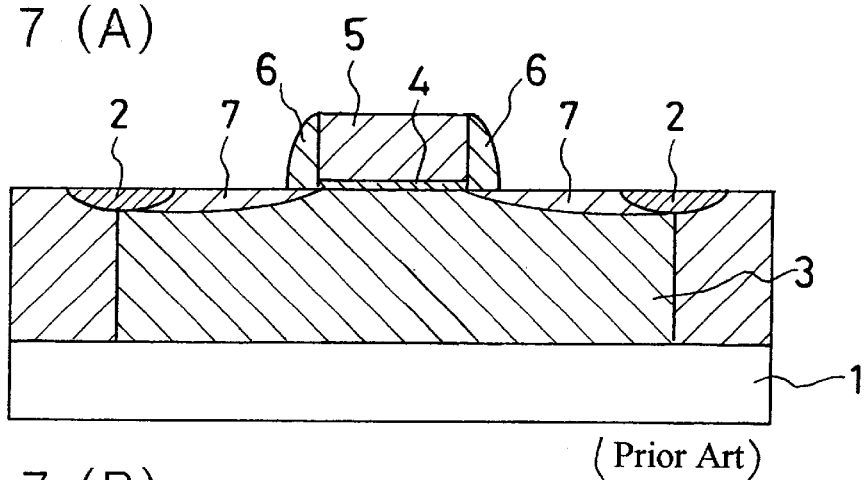
FIG. 7 (A) (Prior Art)
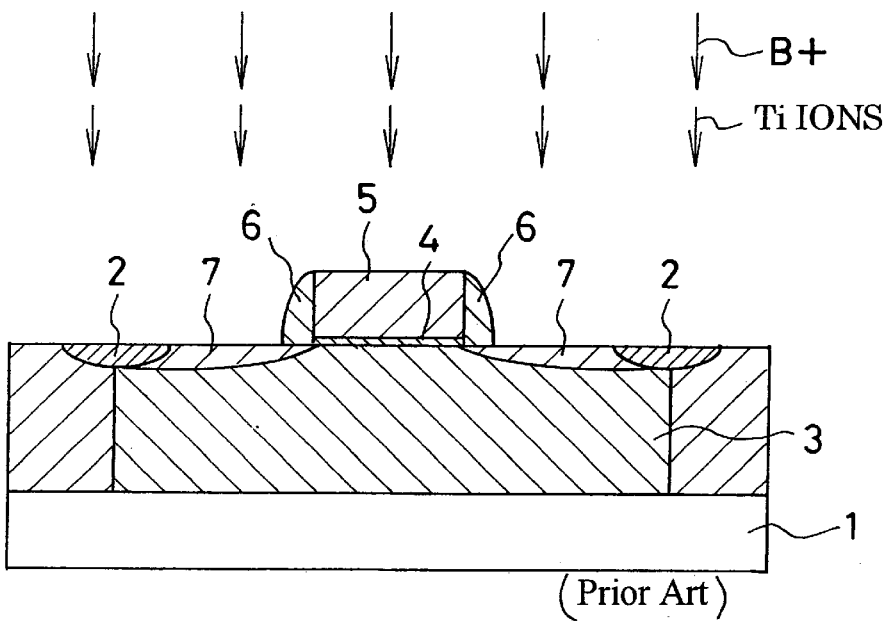
FIG. 7 (B) (Prior Art)
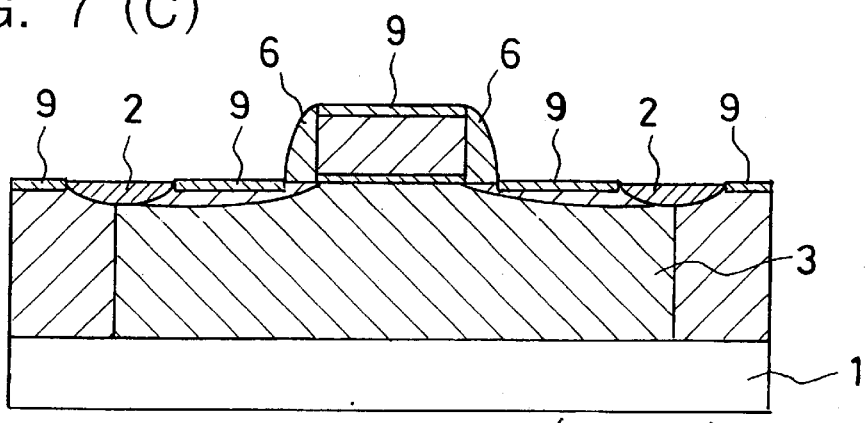
FIG. 7 (C) (Prior Art)

METHOD FOR PRODUCING SEMICONDUCTOR DEVICE

This invention relates to a method for manufacturing a semiconductor device and, more particularly, to a method for manufacturing a semiconductor device containing metal suicides.

BACKGROUND OF THE INVENTION

Referring to FIG. 6, the method for manufacturing a semiconductor device of this type is explained in the sequence of manufacturing steps.

Referring first to FIG. 6A, a device separation area 2 is selectively formed on a semiconductor substrate 1 of silicon (Si) and an N-well region 3 is then formed by ion implantation of phosphorus (P). A gate oxide film 4 and a gate electrode 5 of polysilicon are formed, and a sidewall 6 of an oxide film is formed, on a sidewall of a gate electrode 5. $BF_2$ ions are then implanted by ion-implanation with, for example, an acceleration energy of 20 keV and a dosage of 3E15 ($3 \times 10^{15}$)cm$^{-2}$, followed by heat treatment under the conditions of, for example, 1000° C. and 10 seconds in a nitrogen atmosphere for activation to form a p-type source drain region 7.

Then, as shown in FIG. 6B, arsenic (As) is implanted by ion implantation under the conditions of, for example, 30 keV and 3E14 cm$^{-2}$ to render the surface of the p-type source-drain region 7 and the gate electrode 5 amorphous.

Then, as shown in FIG. 6C, titanium (Ti) is deposited by a sputtering method, followed by heat treatment of, for example, 700° C. for 30 seconds, to form titanium silicide layer 9 on at least the p-type source-drain region 7 and the gate electrode 5. Non-reacted titanium is then removed using a solution obtained on mixing ammonia, hydrogen peroxide and water at a ratio of ammonia: hydrogen peroxide: water of 1:1:5, followed by heat treatment at 800° C. for 10 seconds to lower the resistance of the titanium silicide layer 9.

At this time, titanium silicide layer is not formed in the device separation region 2 of the oxide film nor on the surface of the sidewall 6. In fact, a layer-to-layer insulating film is then formed followed by opening of contact holes and formation of interconnections. These steps, however, are irrelevant to the subject-matter of the present invention and hence are not stated here specifically.

With the above-described conventional manufacturing method, boron (B) contained in the p-type impurity diffusion layer is sucked up by (diffuses into) the titanium silicide layer 9 of a lower concentration during the time the titanium silicide layer 9 is formed on the semiconductor substrate 1, thus lowering the boron concentration on the surface of the p-type impurity diffusion layer.

The result is that the contact resistance between the titanium silicide layer 9 and the p-type impurity layer is increased to lower the current driving capability of the p-type MOS transistor.

As a conventional method for overcoming this inconvenience, there is proposed in e.g., JP Patent Kokai Publication JP-A-4-150019 a manufacturing method in which the boron concentration at an interface between the p-type impurity diffusion layer and the titanium silicide layer is prohibited from being lowered despite formation of the titanium silicide layer for suppressing the contact resistance between the two layers.

FIGS. 7A to 7C show the conventional manufacturing method step-by-step. Referring first to FIG. 7A, a device separation region 2 is formed on a semiconductor substrate 1 mainly composed of silicon. Then, after formation of an N well area 3, boron is implanted by ion implantation into the semiconductor substrate 1 and activated to form a ptype source-drain region 7 near the surface of the semiconductor substrate 1.

Then as shown in FIG. 7B, titanium ions are implanted at an implantation energy of 30 keV and a dosage of 1E17 cm$^{-2}$, using $TiCl_4$ as an ion source, to implant titanium ions near the surface of the p-type source-drain region 7.

If titanium ions are implanted in this manner, titanium ions exist between silicon atoms with a content of the p-type impurities. In this state, boron is further ion-implanted at an implantation energy of 20 keV and a dosage of about 1E15 cm$^{-2}$.

Then, thermal annealing is carried out by a lamp annealing method at a level of 400 to 900° C. This leads to reaction between titanium and silicon in a portion of the semiconductor substrate to form titanium silicide 9, as shown in FIG. 7C.

On the other hand, titanium silicide is not formed on the oxide film of the device separation region etc. In the process in which titanium is reacted with silicon to titanium silicide, boron in titanium silicide is diffused to outside. Since the silicide layer is approximately 50 nm, whilst the peak of boron concentration is approximately 60 nm in depth. Thus, even if boron in the titanium silicide layer is diffused, the concentration of boron in titanium silicide and silicon is extremely high, so that, even under certain diffusion of boron into titanium silicide by heat application in the subsequent process, the boron concentration in the interface between silicon and titanium silicide is not lowered. Thus, the contact resistance between the titanium silicide layer and p-type impurity diffusion layer can be prohibited from being increased.

SUMMARY OF THE DISCLOSURE

However, the following problem has been encountered during the investigation toward the present invention. The above-described manufacturing method proposed in the JP Patent Publication Kokai JP-A-4-150019 has a drawback that, since titanium has been formed by ion implantation, titanium silicide ($TiSi_2$) having an exact composition cannot be formed without difficulties. The sheet resistance of $TiS_2$ is lowered to 10 ohm/sq or less only if it has a structure of $C_{54}$.

It is only in case where Ti is formed by sputtering and annealed under a most optimum condition that $TiSi_2$ with this low resistance value can be produced.

The conventional method of forming titanium by the sputtering method and annealing it to form titanium silicide as shown in FIG. 6 has a drawback that the contact resistance between the titanium silicide layer and the p-type impurity layer is increased resulting in a lower current driving capability of the p-type MOS transistor.

The reason is that boron contained in the p-type impurity diffusion layer is sucked (diffused) up by the titanium silicide layer of a lower concentration at the time of titanium silicide formation thus lowering the boron concentration in the surface portion of the p-type impurity diffusion layer.

In view of the above-described drawback of the conventional method, it is an object of the present invention to provide a novel method for manufacturing a semiconductor device wherein the contact resistance between the titanium silicide layer and the p-type impurity layer can be prevented from being increased to prevent the current driving capability from being lowered to produce a semiconductor device of a higher operating speed.

Other objects of the present invention will become apparent in the entire disclosure.

According to a first aspect of the present invention there is provided a method for manufacturing a semiconductor device including the steps of ion-implanting a first p-type impurity for forming a source-drain, followed by heat-treatment for activating the implanted ions. The method further includes ion-implanting a second p-type impurity, followed by ion-implanting a third impurity for converting the structure of at least a diffusion layer of the source-drain portion into an amorphous state. Thus, titanium silicide ($TiSi_2$) is formed as a layer.

According to the present invention, boron is ion-implanted after forming the source-drain region and before forming $TiSi_2$. The result is that boron in the diffusion layer ceases to be sucked (diffused) up during $TiSi_2$ formation to maintain a high boron concentration in silicon in a portion contacted with $TiSi_2$ to lower the contact resistance resulting in an increased transistor on-current to raise the circuit operating speed.

BRIEF DESCRIPTION OF THE DRAWINGS

FIGS. 7A to 7C are cross-sectional views showing another conventional method for manufacturing a semiconductor device step-by-step.

PREFERRED EMBODIMENTS OF THE INVENTION

Figure 1:
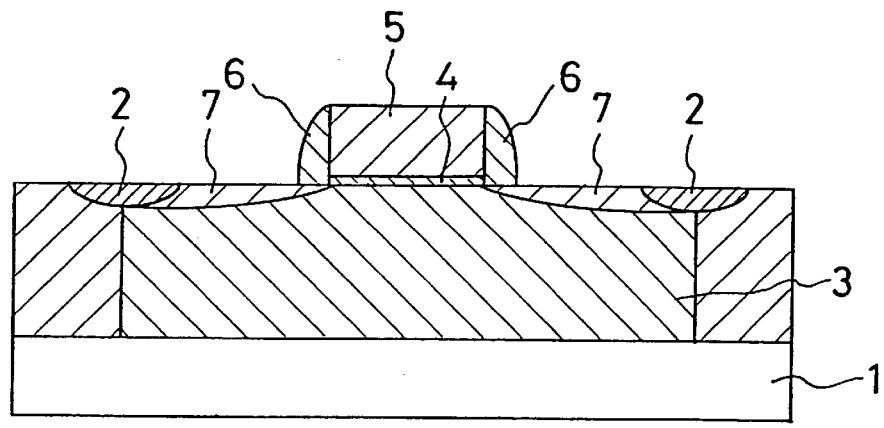
FIGS. 1A and 1B are cross-sectional views showing the process of the first Example of the method for manufacturing the semiconductor device of the present invention, step-by-step.
Figure 1:
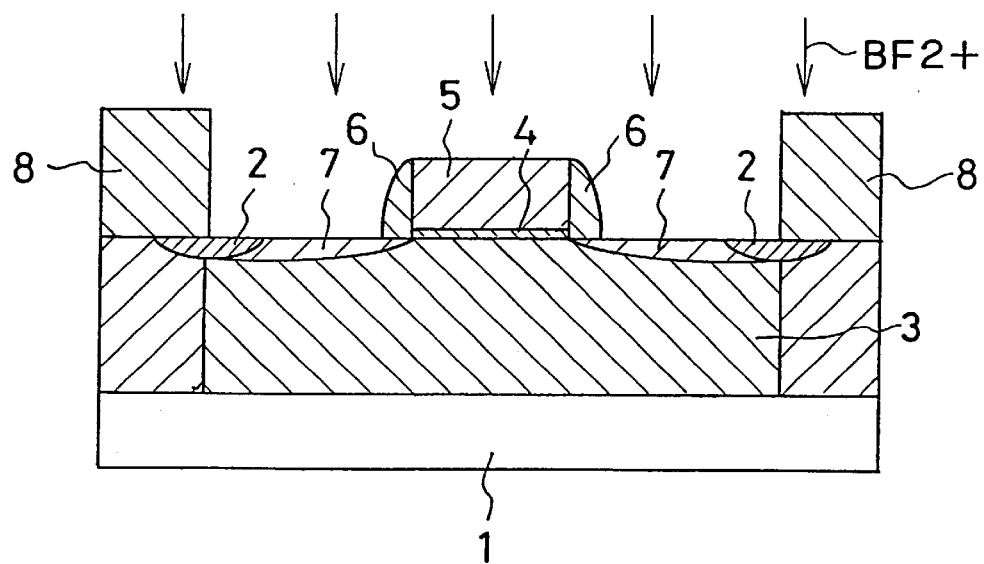

The present invention is now explained with reference to its preferred embodiments. The preferred embodiments of the manufacturing method for the semiconductor device according to the present invention include (a) step of ion-implanting a first p-type impurity to form a source-drain; (b) heat-treatment step to activate implanted ions (see FIG. 1A) and a step of ion-implanting a second p-type impurity (see FIG. 1B); (c) step of ion-implanting a third impurity for converting the structure of at least the diffusion layer of the source-drain portion into an amorphous state (see FIG. 1C), and (d) forming titanium silicide ($TiSi_2$) (see FIG. 1D).

In the above process, the first impurity is preferably $BF_2$, while the second impurity is B or $BF_2$. The third impurity is preferably As.

In a preferred form of the present invention, the step (d) of forming the above $TiSi_2$ includes a sub-step (d-1) of forming a Ti layer by the sputtering method, a heat-annealing sub-step (d-2), a sub-step (d-3) of removing non-reacted Ti by wet etching, and a second heat annealing sub-step (d-4).

In a preferred form of the present invention, the ion implantation of the second p-type impurity is by rotational oblique (tilted) implantation.

EXAMPLES

For detailed explanation of the above-described embodiments of the present invention, examples of the invention will be explained by referring to the drawings.

Example 1

Figure 2:
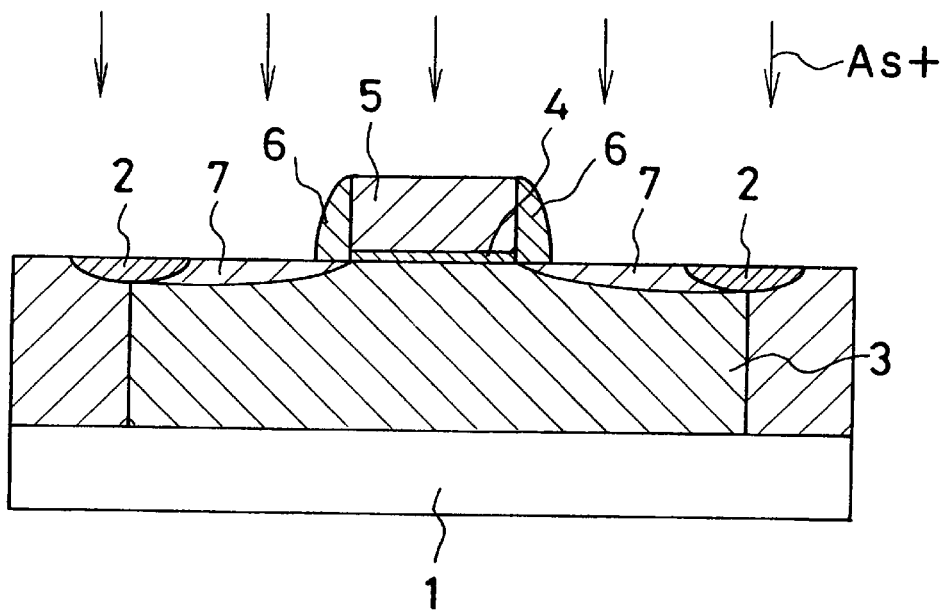
FIGS. 2C and 2D are cross-sectional views showing the process of the first Example of the method for manufacturing the semiconductor device of the present invention, step-by-step.
Figure 2:
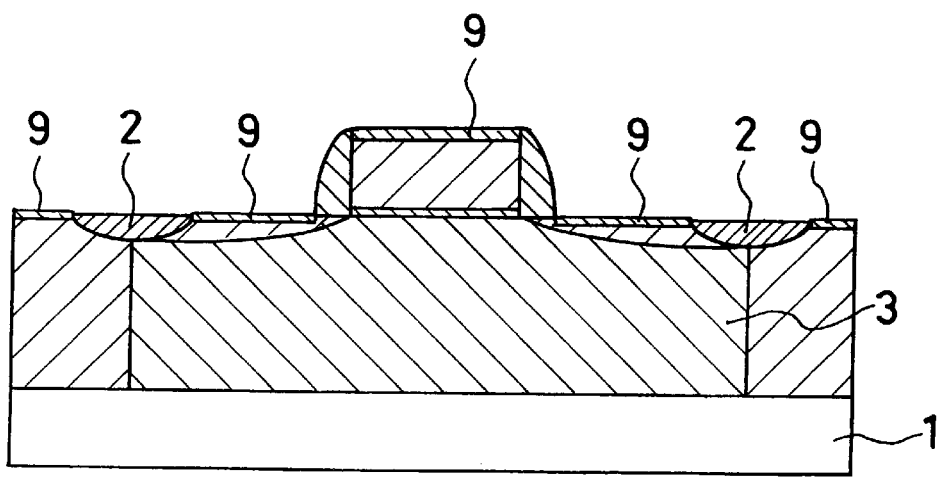

FIGS. 1 and 2 are cross-sectional views for illustrating the manufacturing method of a first example of the present invention step-by-step. FIGS. 1 and 2 together make up a sole figure and are drawn separately only for convenience in drawing.

Referring first to FIG. 1A, a device separation region 2 is selectively formed on a semiconductor substrate 1 of substantially silicon and an N-well region 3 is formed by ion implantation of phosphorus (under conditions of, for example, $1003E14$ $cm^{-2}$). A gate oxide film 4 of a film thickness of, foeample, 5 nm, and a gate electrode 5 of polysilicon of a film thickness of, for example, 200 nm, are formed. A sidewall 6 of an oxide film is formed on the lateral (surrounding) surface of the gate electrode 5. $BF_2$ ions are ion-implanted under a condition of, for example, an acceleration energy of 20 keV and a dosage of $3E15$ $cm^{-2}$ followed by heat treatment in a nonoxidizing atmosphere, e.g., nitrogen atmosphere at 1000° C. for 10 seconds for activation resulting in formation of a p-type source-drain region 7.

Then, as shown in FIG. 1B, $BF_2$ ions are selectively side-implanted (doped) into a region inclusive of the p-type source-drain region 7 using a photoresist 8 as a mask. The ion implantation conditions include, for example, an acceleration energy of 20 keV, a dosage of $1E15$ $cm^{-2}$ and an implantation (tilting) angle of 0°. Then, as shown in FIG. 2C, arsenic is ion-implanted at, for example, 30 keV and a dosage of $3E14$ $cm^{-2}$ to convert the surface structure of the p-type source-drain region 7 and the gate electrode 5 into an amorphous state.

Then, as shown in FIG. 2D, titanium is formed by a sputtering method. Then, by heat treatment at, for example, 700° C. for 30 seconds, titanium silicide 8 is formed on at least the p-type source-drain region 7 and the gate electrode 5. Non-reacted titanium is then removed, using an etching solution composed of ammonia, hydrogen peroxide and water at a ratio of ammonia: hydrogen peroxide: water of 1:1:5. Then, heat treatment is carried out at, for example, 800° C. for 10 seconds to lower the resistance of titanium silicide 9.

At this time, titanium silicide is not formed on the surface of the sidewall 6 nor the device separation region 2 of an oxide film. In the usual practice, an inter-layer (layer-to-layer) insulating film is then formed followed by opening of contact holes (vias) and formation of circuit lines. These steps, however, are irrelevant to the subject-matter of the present invention and hence are not stated here specifically.

The operation and effect of the first example of the present invention are now explained. In the first example, prior to the activation of the source-drain impurity the re-implantation of $BF_2$ into the p-type source-drain region is performed preceding the formation of $TiSi_2$. Thus, even if boron in silicon is sucked (diffused) up during the formation progress of titanium silicide, a sufficient amount of boron is still present in silicon, so that the contact resistance between the titanium silicide layer and silicon is reduced to increase the transistor on-current.

Moreover, since titanium is produced in the first Example by the sputtering method, titanium atoms of a sufficient concentration to allow titanium silicide to be produced, are present, thus enabling a low-resistance titanium silicide layer to be produced.

Figure 5:
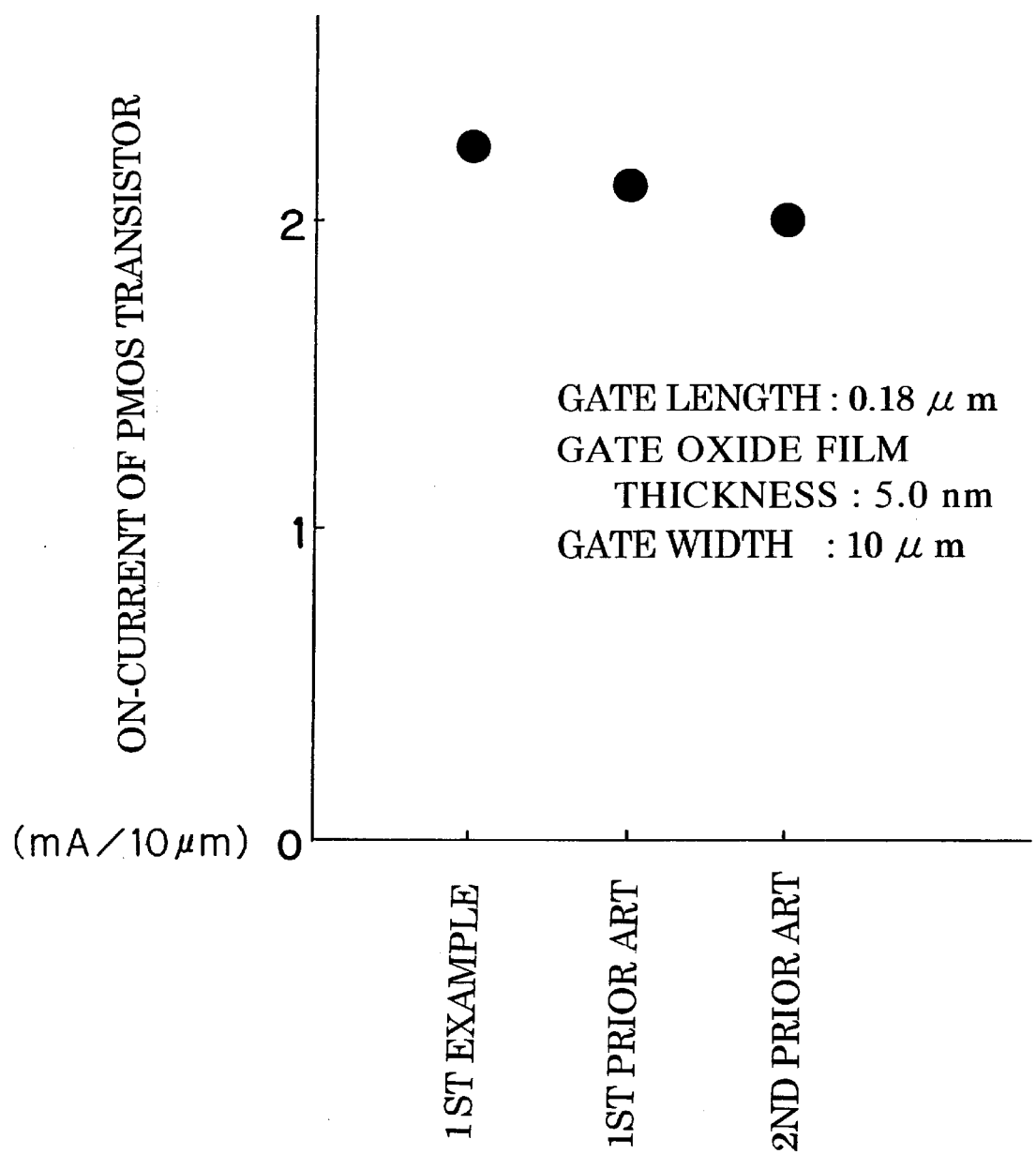
FIG. 5 shows the effect of the first Example of the invention in comparison with the conventional manufacturing methods.
Figure 6:
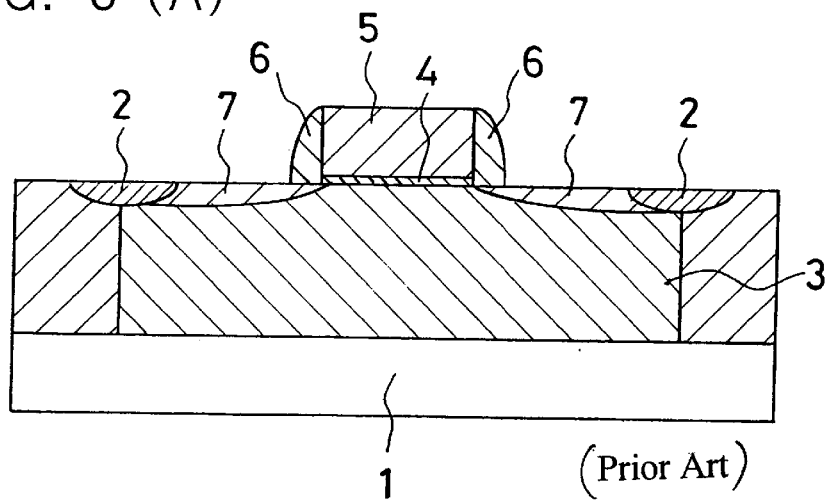
FIGS. 6A to 6C are cross-sectional views showing a conventional method for manufacturing a semiconductor device step-by-step.
Figure 6:
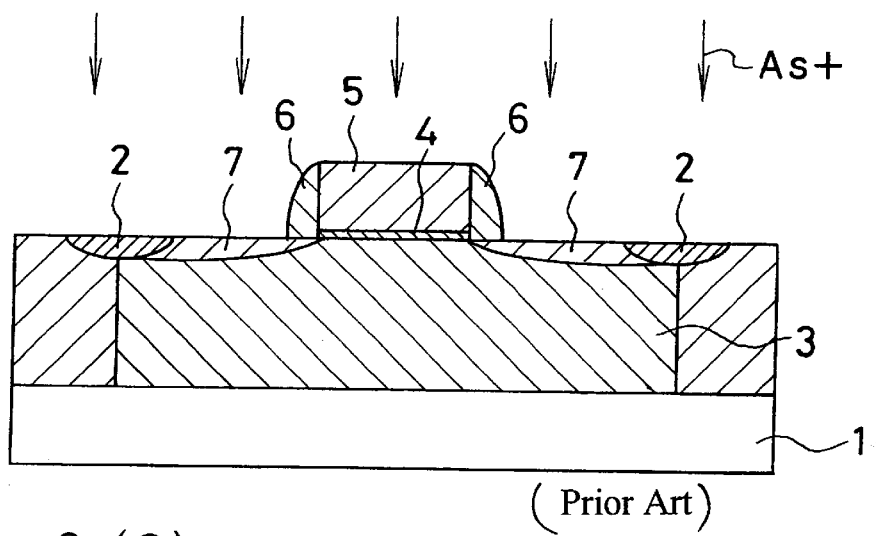
Figure 6:
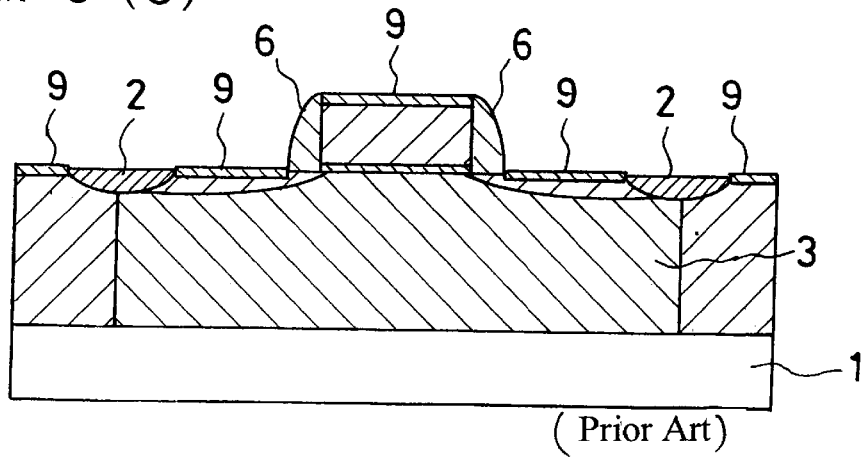

FIG. 5 shows, by way of comparison, the on-current of a p-type MOS transistor of the present Example, that of the first prior-art example explained as a comparative example by referring to FIG. 6 and that of the second prior-art example explained as a comparative example by referring to FIG. 7.

Referring to FIG. 5, the on-current can be improved with the present Example by approximately 5% as compared to that of the first prior-art example and by approximately 8% as compared to that of the second prior-art example.

The reason is that, since the contact resistance between titanium silicide and silicon of the p-type source-drain region becomes lower than that of the first part example, and that the layer resistance of titanium silicide is lower than that of the second prior-art example.

Example 2

Figure 3A:
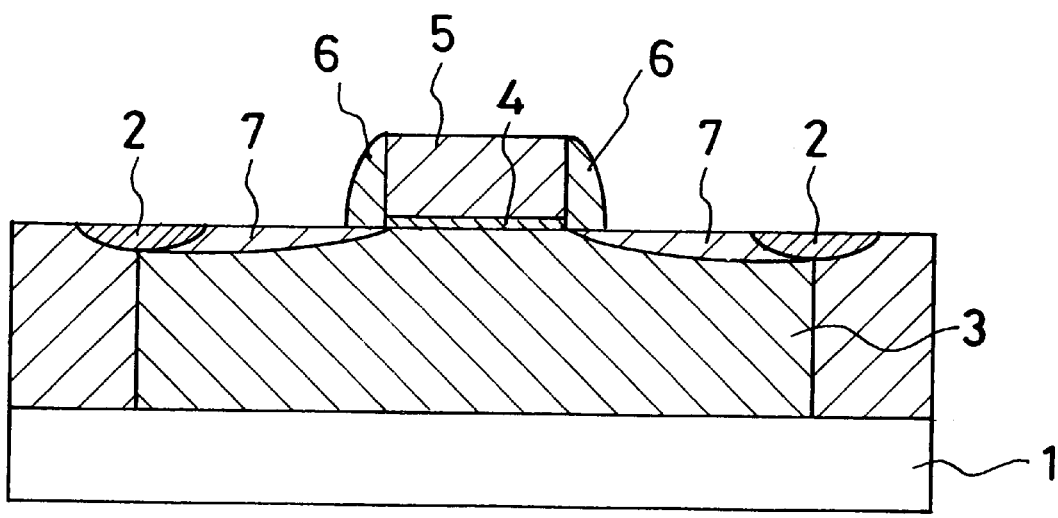
FIGS. 3A and 3B are cross-sectional views showing the process of the second Example of the method for manufacturing the semiconductor device of the present invention, step-by-step.
Figure 3B:
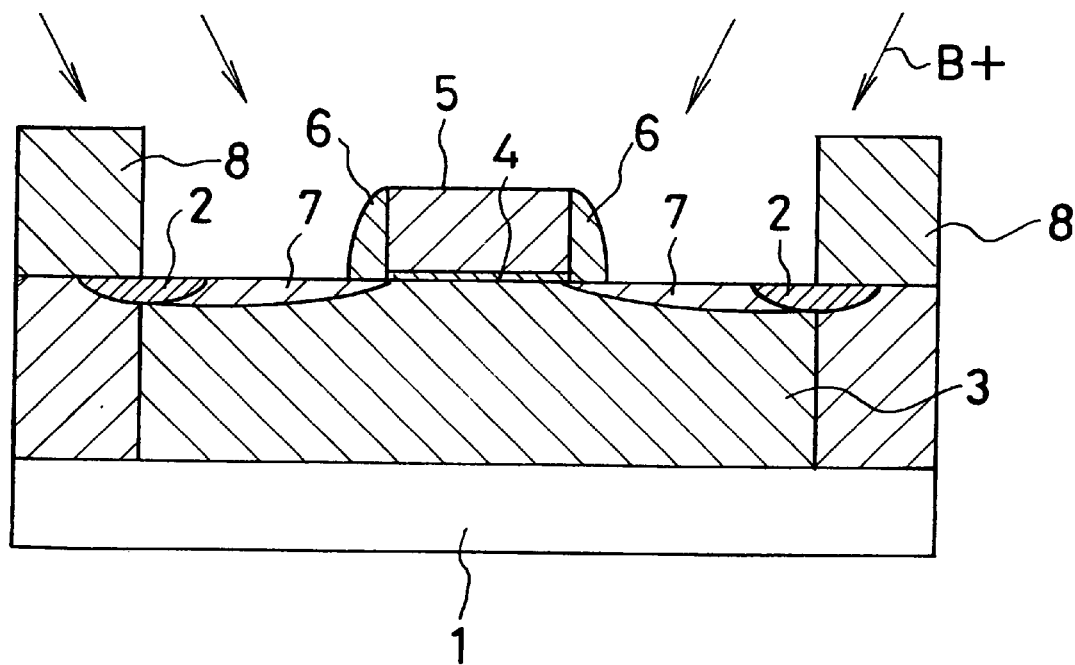
Figure 4:
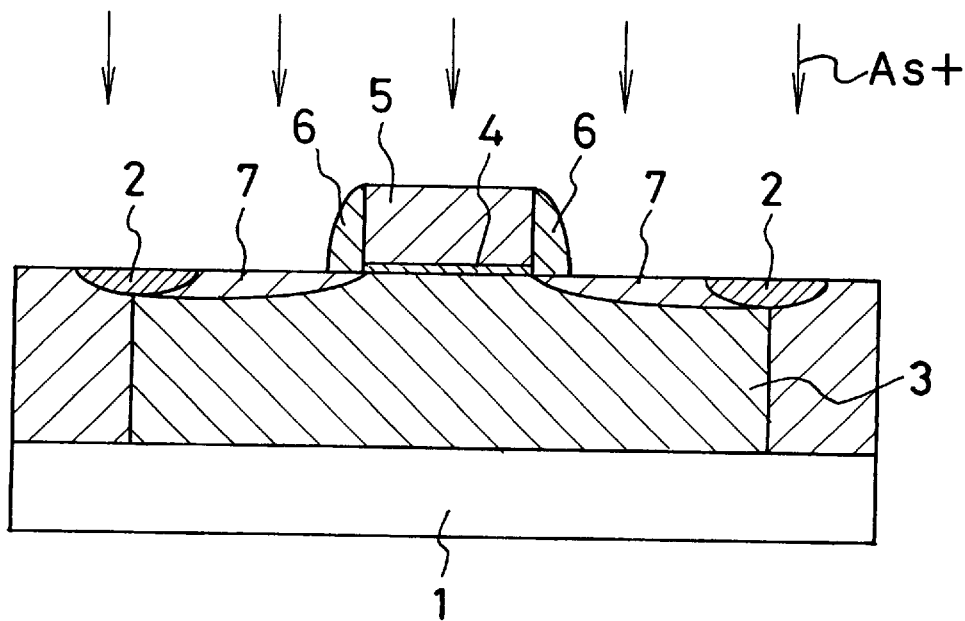
FIGS. 4C and 4D are cross-sectional views showing the process of the second Example of the method for manufacturing the semiconductor device of the present invention, step-by-step.
Figure 4:
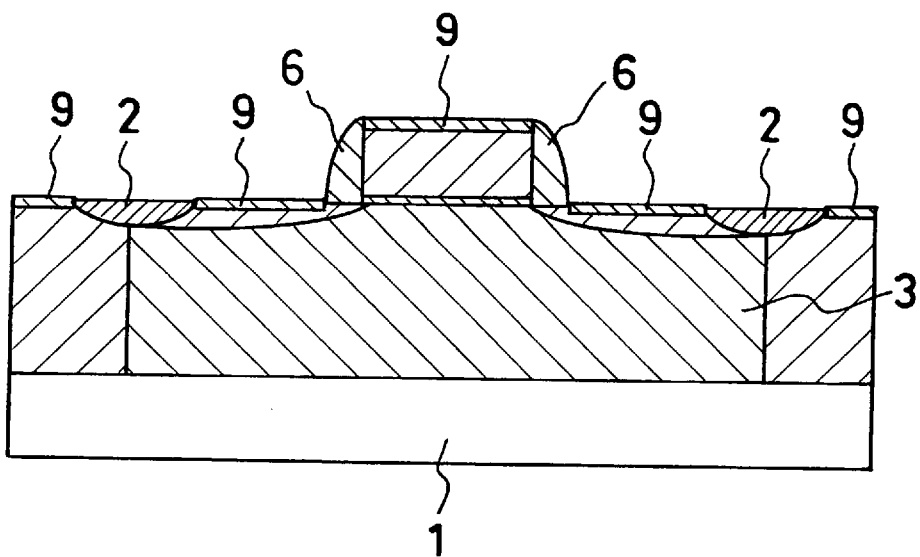

The second Example of the present invention is explained by referring to FIGS. 3 and 4. The formation of the device separation region, gate oxide film and gate electrodes, followed by formation of the source-drain region by ion implantation and activation, are similar to those of the above-described first Example and hence are not explained specifically. FIG. 3A corresponds to FIG. 1A of the above-described first Example. FIGS. 3 and 4 together make up a sole figure (in the suffixed alphabetical order) and are drawn separately only for convenience in drawing.

Next, as shown in FIG. 3B, boron is selectively ion-implanted into a region inclusive of the p-type source drain region 7, using a photoresist 8 as a mask. The ion implantation conditions include, for example, an acceleration energy of 5 keV, a dosage of $1E15$ $cm^{-2}$ and rotational implantation with an implantation (tilting) angle of 7 to 15°.

Then, as shown in FIG. 4C, arsenic is ion-implanted at, for example, 30 keV and a dosage of $3E14$ $cm^{-2}$ to convert the surface structure of the p-type source-drain region 7 and the gate electrode 5 into an amorphous structure.

Then, as shown in FIG. 4D, titanium is formed by a sputtering method. Then, by heat treatment at, for example, 700° C. for 30 seconds, titanium silicide 9 is formed on the surface of at least the p-type source-drain region 7 and the gate electrode 5. Non-reacted titanium is then removed, using an etching solution composed of ammonia, hydrogen peroxide and water at a ratio of ammonia: hydrogen peroxide: water of 1:1:5. Then, heat treatment is carried out at, for example, 800° C. for 10 seconds to lower the resistance of titanium silicide 9. In the usual practice, an inter-layer insulating film is then formed followed by formation of contact holes and formation of interconnections making up circuit lines. The corresponding description, however, is omitted for simplicity.

This Example has a merit that, since boron is rotationally implanted, at a tilting angle, the boron concentration in silicon in a portion near the source-drain end in contact with the $TiSi_2$ layer becomes higher thus further increasing the effect of increasing the on-current of the p-type MOS transistor.

Although the description of the above Examples has been made using $TiSi_2$ as a metal silicide, the present invention is not limited thereto but may also be applied to silicides of other metals, such as Co, Ni, Mo and Pt.

According to the present invention, as described above, the contact resistance between $TiSi_2$ and silicon is decreased to improve on current of the transistor.

The reason is that, even if certain amount of boron in silicon is sucked up during formation of $TiSi_2$, a sufficient amount of boron still exists in the silicon surface thus decreasing the contact resistance between silicon and $TiSi_2$.

It should be noted that modification obvious in the art may be done without departing the gist and scope of the present invention as disclosed herein and claimed hereinbelow as appended.

What is claimed is:

1. A method for manufacturing a semiconductor device comprising the steps of:
    ion-implanting a first p-type impurity to form a source drain;
    heat-treating to active the implanted ions;
    ion-implanting a second p-type impurity;
    ion-implanting a third impurity to amorphasize at least a diffusion layer of a source-drain portion;
    forming titanium silicide ($TiSi_2$), comprising:
        a step of sputtering Ti;
        a first heat-annealing step;
        a step of removing non-reacted Ti by wet etching;
        a second heat annealing step to lower the resistance of a resulting layer of titanium silicide; and
        removing non-reacted metal by etching and subsequently lowering the resistance of the resulting layer of titanium silicide by heat treatment.

2. The method for manufacturing a semiconductor device as defined in claim 1 wherein said first p-type impurity is $BF_2$.

3. The method for manufacturing a semiconductor device as defined in claim 1 wherein said second p-type impurity is B or $BF_2$.

4. The method for manufacturing a semiconductor device as defined in claim 1 wherein the ion implantation of said second p-type impurity is rotational oblique implantation.

5. The method for manufacturing a semiconductor device as defined in claim 1 wherein said third impurity is As.

6. A method for manufacturing a semiconductor device comprising the steps of:
    (a) forming a source-drain area by ion-implanting a first p-type impurity into the source-drain forming area and activating the ions by heat treatment;
    (b) ion-implanting a second p-type impurity into an area inclusive of said source-drain area;
    (c) amorsphosizing at least the surface of the source-drain area by ion-implanting a third impurity into the source-drain forming area;
    (d) sputtering metal followed by forming a metal silicide by heat treatment; and
    (e) removing non-reacted metal by etching and subsequently lowering the resistance of a resulting layer of metal silicide by heat treatment.

7. The method for manufacturing a semiconductor device as defined in claim 6 wherein said metal is Ti.

8. The method for manufacturing a semiconductor device as defined in claim 6 wherein said metal is one of Co, Ni, Mo and Pt.

9. The method for manufacturing a semiconductor device as defined in claim 6 wherein said ion-implantation of the second p-type impurity in said step (b) is rotational oblique implantation.

10. The method of claim 6, wherein said first p-type impurity is $BF_2$.

11. The method of claim 6, wherein said second p-type impurity is one of B and $BF_2$.

12. The method of claim 6, wherein said third impurity is As.

13. The method of claim 6, wherein said metal silicide is titanium silicide, and said sputtering metal by forming a metal silicide by heat treatment further comprises:

sputtering Ti;

a first heat-annealing step;

removing non-reacted Ti by wet etching; and a second heat annealing step.

* * * * *